United States Patent
Chang et al.

(10) Patent No.: US 7,638,799 B2
(45) Date of Patent: Dec. 29, 2009

(54) IMAGE SENSOR STRUCTURE WITH RECESSED SEPARATOR LAYER

(75) Inventors: Jin-Wei Chang, Yilan (TW); Hong-Xian Wang, Kaohsiung (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 0 days.

(21) Appl. No.: 11/706,194

(22) Filed: Feb. 15, 2007

(65) Prior Publication Data
US 2008/0067621 A1    Mar. 20, 2008

(30) Foreign Application Priority Data
Sep. 20, 2006  (TW) .............................. 95134791 A

(51) Int. Cl.
*H01L 31/00*  (2006.01)
(52) U.S. Cl. .................. 257/53; 257/E29.336
(58) Field of Classification Search ............. 257/53, 257/444, 446, 461–465, 458, 459, E29.336, 257/466; 438/57–98
See application file for complete search history.

(56) References Cited

U.S. PATENT DOCUMENTS

| | | | | |
|---|---|---|---|---|
| 6,373,117 | B1 * | 4/2002 | Theil | 257/444 |
| 2004/0041224 | A1 * | 3/2004 | Chao et al. | 257/444 |
| 2004/0266053 | A1 * | 12/2004 | Varghese | 438/94 |
| 2006/0049439 | A1 * | 3/2006 | Oh et al. | 257/292 |
| 2006/0118795 | A1 * | 6/2006 | Araki | 257/83 |

* cited by examiner

*Primary Examiner*—Hsien-ming Lee
*Assistant Examiner*—Kevin Parendo
(74) *Attorney, Agent, or Firm*—Muncy, Geissler, Olds & Lowe, PLLC

(57) ABSTRACT

An image sensor structure includes a plurality of pixels formed on a substrate. Each pixel includes an image senor interconnect structure, a separator layer and an electrode layer, wherein the separator layer has a first thickness an a sidewall of the separator layer is recessed from a sidewall of the electrode layer. A first doped amorphous silicon layer id formed on the electrode layer, wherein the separator layer and the first doped amorphous silicon layer of a pixel are disconnected from that of an adjacent pixel.

9 Claims, 7 Drawing Sheets

IMAGE SENSOR STRUCTURE WITH RECESSED SEPARATOR LAYER

BACKGROUND OF THE INVENTION

1. Field of the Invention

The invention relates to an image sensor structure and method of fabricating the same, and more particularly to a photodiode layer of a photoconductor on active pixel (POAP) image sensor structure and method of fabricating the same.

2. Description of the Related Art

Photoconductor on active pixel (POAP) image sensors are widely applied in many fields such as digital cameras, digital video cameras, monitors and mobile phones. POAP image sensors employ photoconductors, such as photoconductor covered active pixels or image sensor cell arrays, to convert optical light into electrical signal.

POAP image sensors are capable of detecting light of various wavelength such as visible light, X-ray, ultraviolet (UV) and infrared ray (IR). Electrons are generated by incidental light absorbed by photoconductors formed on the top of POAP image sensors, and transported to circuits below the photoconductors. Compared with conventional image sensors, POAP image sensors have higher photosensitivity, better light collection, and higher pixel density. FIG. 1 is a cross sectional view of a conventional POAP image sensor structure 10. An incident light passes through a transparent conductive layer 145 in a pixel area (N-1, 1) or (N, 1) to a photodiode structure 135. The photodiode structure 135 converts the incident light into an electrical signal and transports the electrical signal to an active region 130 in a substrate 11.

A dark environment is desirable for POAP image sensors to achieve advantages such as high image quality, low crosstalk, low noise and high quality image. In the conventional POAP image sensor structure 10, however, the photodiode structure 135 in different pixel areas (N-1, 1) and (N, 1) is a continuous layer as shown in FIG. 1. Incident light with a large angle radiates in a pixel area (N-1, 1). The electrical signal converted by the photodiode structure 135 in the pixel area (N-1, 1) is transported to the active region 130 of the adjacent pixel area (N, 1) due to the continuous photodiode structure 135. Crosstalk may occur when current flows from higher-potential pixel area (N-1, 1) to neighboring, lower-potential, pixel area (N, 1). Crosstalk results in blurred image, reduces resolution, and color transposition. Thus the performance of the image sensor structure suffers. The crosstalk problem is more serious when the density of the image sensor is increased by shrinking the pixel area or using a multi-layer dielectric structure.

An image sensor structure with low crosstalk capable of solving the described problems is desirable.

BRIEF SUMMARY OF INVENTION

A detailed description is given in the following embodiments with reference to the accompanying drawings.

An image sensor structure and method of fabricating the same are provided. An exemplary embodiment of a method for fabricating an image sensor structure comprises: providing a substrate; sequentially forming an image sensor interconnect structure, a separator layer and a patterned electrode layer on the substrate; removing the separator layer not covered by the patterned electrode layer to form a patterned separator layer, wherein a sidewall of the patterned separator layer is recessed to a sidewall of the patterned electrode layer; forming a first doped amorphous silicon layer, wherein the first doped amorphous silicon layer is a discontinuous layer.

An exemplary embodiment of an image sensor structure comprises: a substrate; an image sensor interconnect structure, a patterned separator layer and a patterned electrode layer formed in the substrate in sequence, wherein the patterned electrode layer has a first thickness, the side wall of the patterned separator layer is separated from the side wall of the patterned electrode layer by a first distance; and a first doped amorphous layer formed on the patterned electrode layer, wherein the first doped amorphous layer is a discontinuous layer

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
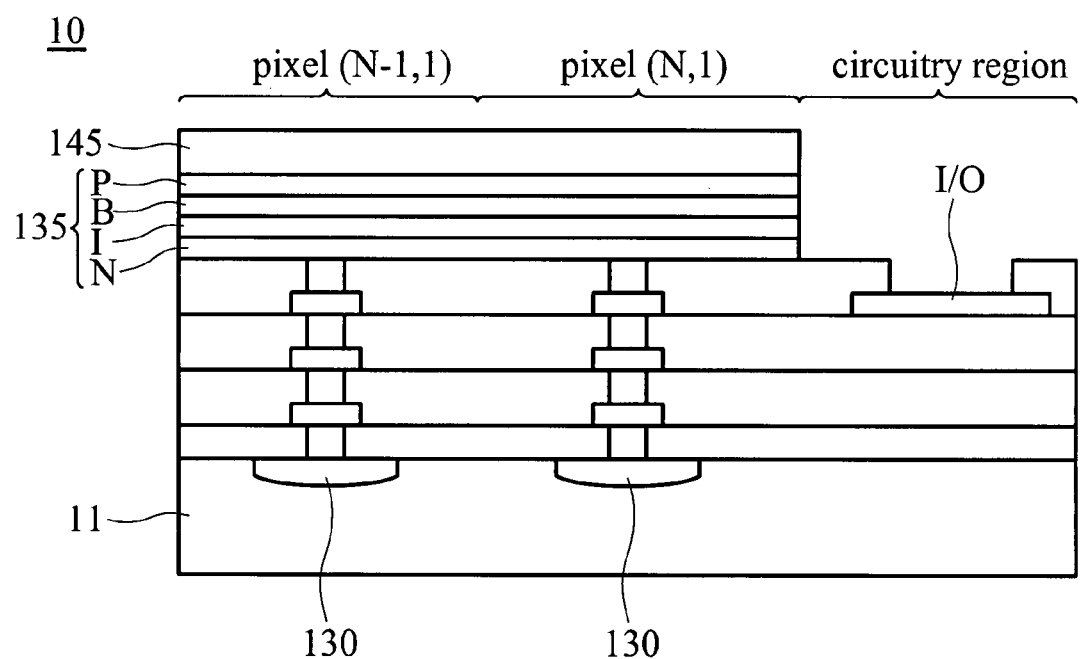
FIG. 1 shows a cross section of a conventional POAP image sensor structure.

The following description is of the best-contemplated mode of carrying out the invention. This description is made for the purpose of illustrating the general principles of the invention and should not be taken in a limiting sense. The scope of the invention is best determined by reference to the appended claims.

FIGS. 2a to 2f show cross sections of various embodiments of a process for fabricating an image sensor structure. Wherever possible, the same reference numbers are used in the drawings and descriptions to refer to the same or like parts.

Figure 2A:
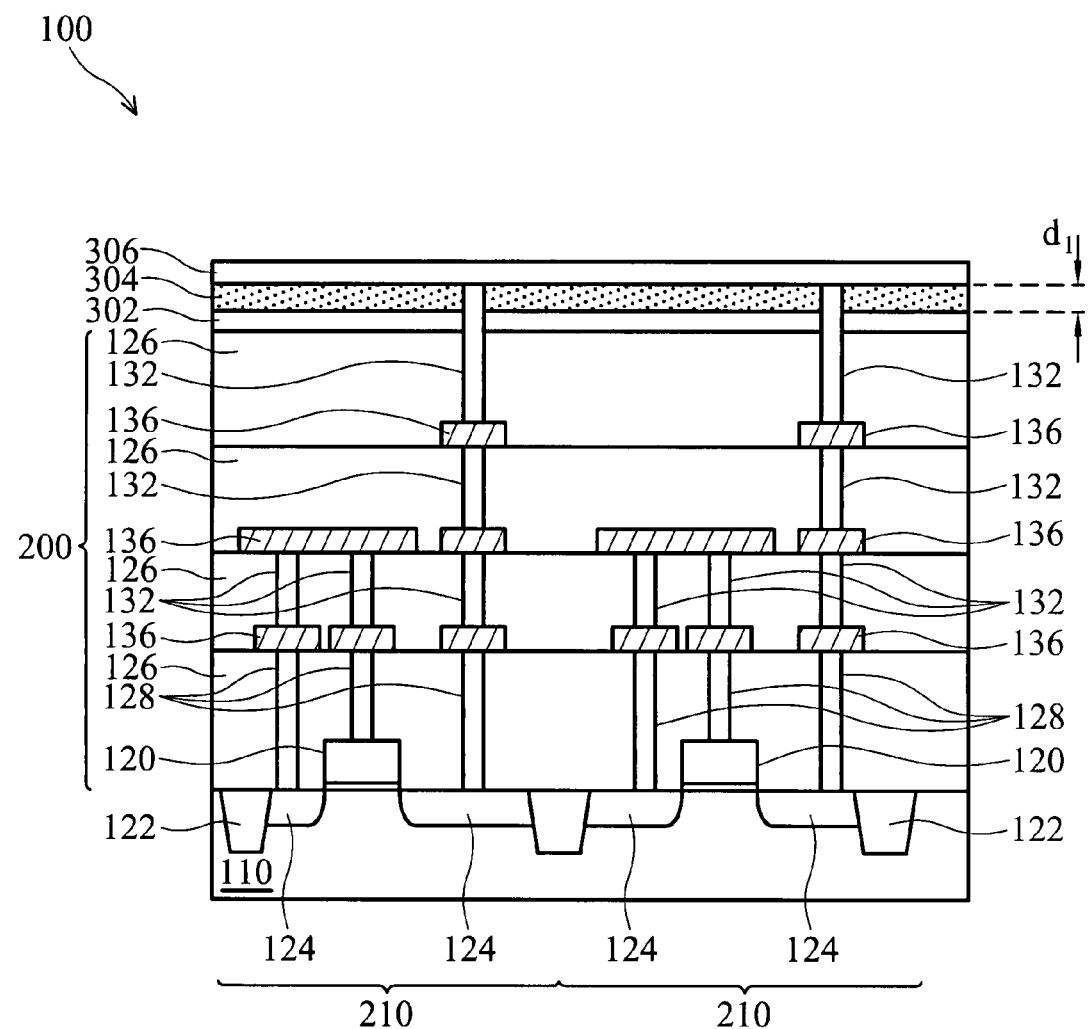
FIGS. 2a to 2f show cross sections of an exemplary embodiment of an image sensor structure of the invention.

FIGS. 2a to 2f show cross sections of an exemplary embodiment of an image sensor structure 100. FIG. 2a shows the primary elements of the image sensor structure 100. Image sensor structure 100 comprises a substrate 110 comprising a plurality of pixel regions 210. The substrate 110 may comprise silicon, silicon on insulator (SOI) substrate, and other commonly used semiconductor substrates can be used. A plurality of shallow trench isolations (STI) 122 is formed in the substrate 110. One or a plurality of image sensor interconnect structures 200 is formed separately in each pixel region 210. The image sensor interconnect structure 200 may comprise CMOS transistors 120, interlayer dielectric (ILD) layers 126 formed thereon, contacts 128, metal interconnects 136 and vias 132. The contacts 128, the metal interconnects 136 and the vias 132 are used for electrically connecting the CMOS transistors 120 and source/drain regions 124 in the pixel region 210. The ILD layer 126 may comprise $SiO_2$, $SiN_X$, SiON, PSG, BPSG, F-containing $SiO_2$ and other low-k materials with a dielectric constant of less than 3.9. The metal interconnects 136 may comprise aluminum (Al), aluminum-alloy, copper (Cu), copper-alloy or other copper-based conductive materials. The contacts 128 and the vias 132 may comprise tungsten (W), aluminum (Al), copper (Cu) or silicides. An etching stop layer 302, a separator layer 304 and an electrode layer 306 are formed on the image sensor interconnect structures 200 in sequence. The vias 132 formed in each pixel region 210 are piercing through the etching stop layer 302 and the separator layer 304 to electrically connect the electrode layer 306. The etching stop layer 302 and the separator layer 304 have a preferable etch selectivity, of about 1:1 to 1000:1, more preferably of about 50:1 to 500:1, most preferably of about 100:1 to 300:1. Material compositions with different etch selectivity can be properly selected to form the etching stop layer 302 and the separator layer 304. For example, when the etching stop layer 302 is nitride, the separator layer 304 can be oxide. When the etching stop layer 302 is oxide, the separator layer 304 can be nitride. The separator layer 304 has a thickness $d_1$, preferably of about 200 Å to 10000 Å. The electrode layer 306 may comprise titanium nitride (TiN), aluminum, aluminum-alloy, copper, copper-alloy or other copper-based conductive material with a thickness of about 200 Å to 1000 Å.

The etching stop layer 302 is used as a stop layer for the following separator layer 304 removal process, and is an optional element. The separator layer 304 can be directly formed on the image sensor interconnect structures 200. Furthermore, the separator layer 304 and the ILD layer 126 have better etch selectivity to prevent damage to the image sensor interconnect structures 200 during the separator layer 304 removal process.

Figure 2B:
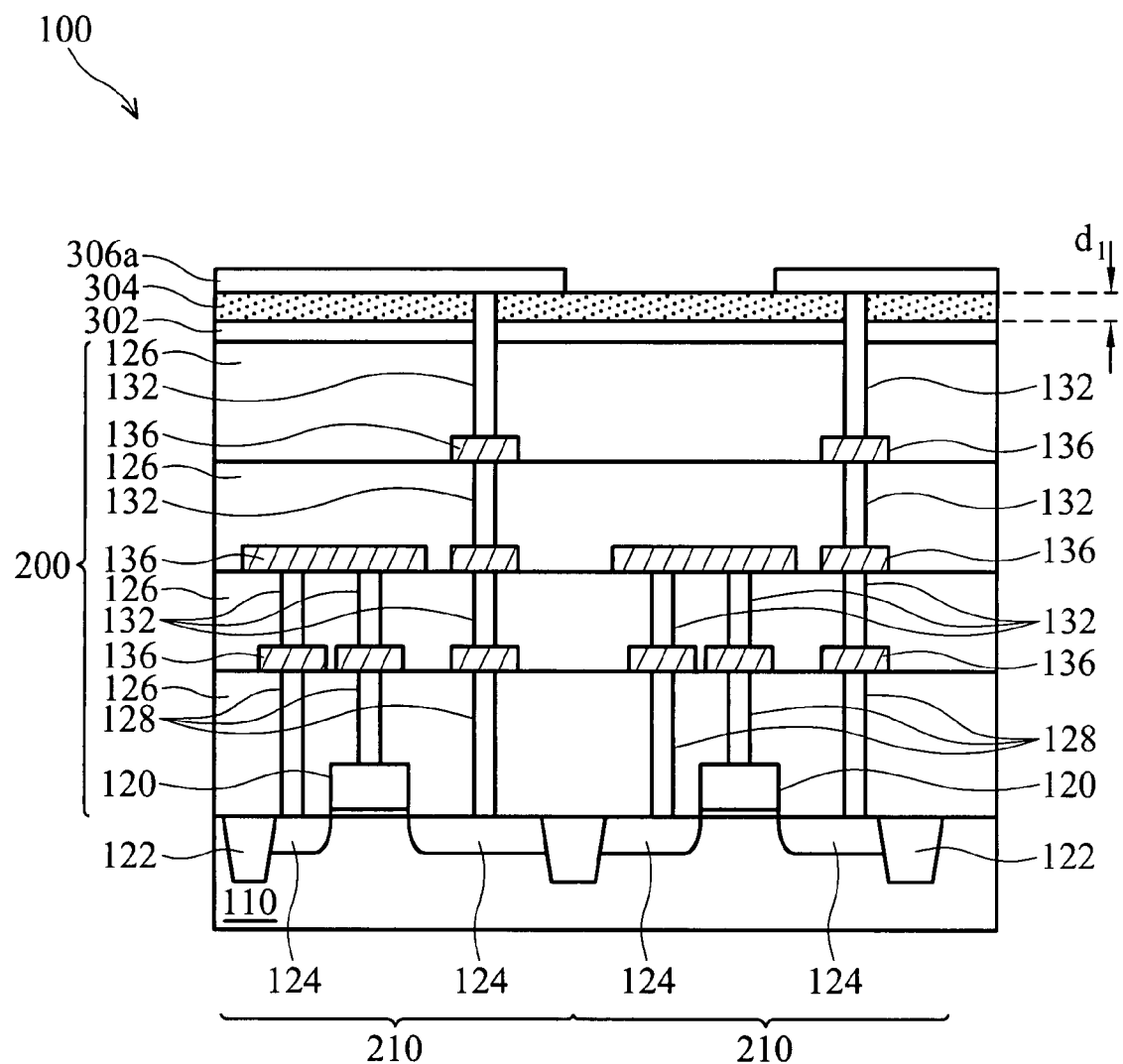
Figure 2C:
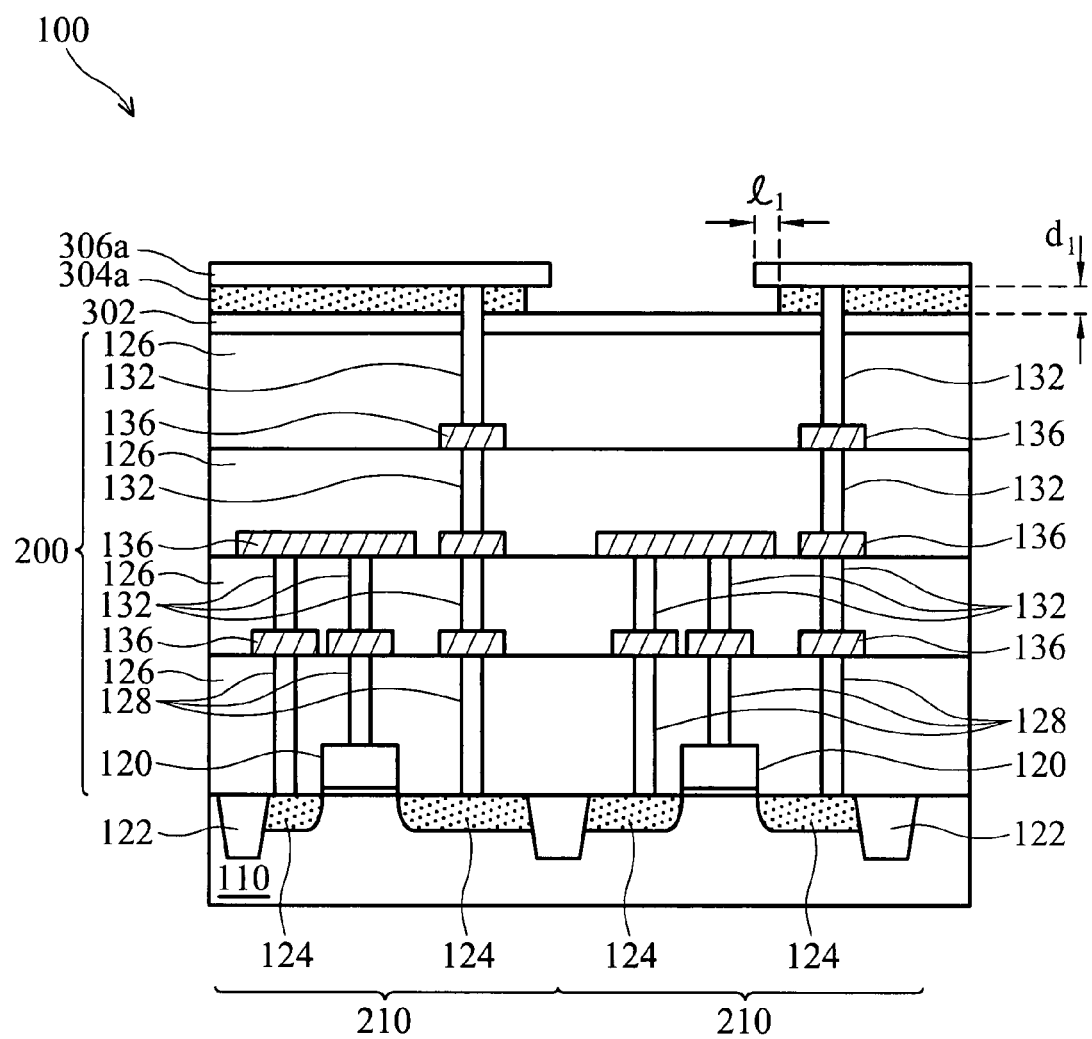

Referring to FIG. 2b, a patterned electrode layer 306a is formed in each pixel region 210 by lithography and etching processes. Next, referring to FIG. 2c, the separator layer 304 not covered by the patterned electrode layer 306a is removed until the etching stop layer 302 is exposed, wherein the patterned electrode layer 306a is used as a mask to form a patterned separator layer 304a by wet etching with an etchant such as HF. Due to the higher selectivity of the patterned separator layer 304a to the patterned separator layer 304a, the profile of the patterned electrode layer 306a can be maintained while forming the patterned separator layer 304a. In addition, part of a sidewall of the patterned separator layer 304a is removed using the isotropic characteristics of the wet etching process. The patterned electrode layer 306a has a thickness $d_1$, the sidewall of the patterned separator layer 304a is recessed from the sidewall of the patterned electrode layer 306a by a distance $l_1$. A proper ratio of the distance $l_1$ to the thickness $d_1$ of the patterned separator layer 304a (referred to as the aspect ratio) is desired. As shown in FIG. 2c, the aspect ratio of the patterned separator layer 304a is preferably about 1:1 to 50:1, more preferably about 2:1 to 40:1, and most preferably about 3:1 to 30:1. For example, the proper aspect ratio can be determined by the wet etching time or the thickness of the patterned separator layer 304a.

Figure 2D:
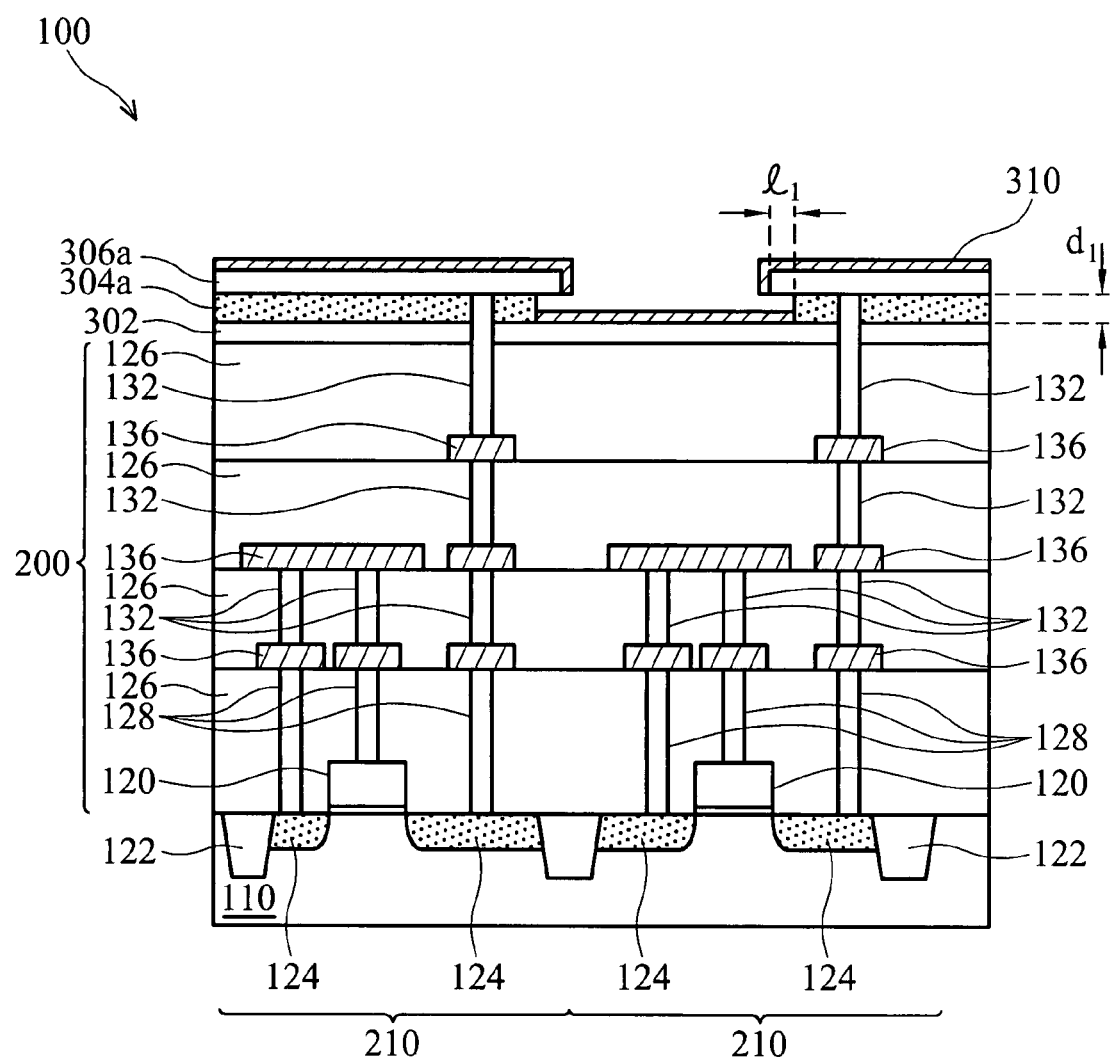

Referring to FIG. 2d, a first doped amorphous silicon (α-Si) layer 310 is formed on the patterned electrode layer 306a and the exposed etching stop layer 302 by a deposition process such as plasma enhanced chemical vapor deposition (PECVD), low pressure chemical vapor deposition (LPCVD), atmosphere CVD (ATCVD) or other deposition processes. The first doped amorphous silicon layer 310 has a preferable thickness, of less than 200 Å. Due to the poor gap filling ability of PECVD, the first doped amorphous silicon layer 310 won't be formed on the -sidewall of the patterned separator layer 304a while the aspect ratio of the patterned separator layer 304a is larger than a predetermined value. Thus, the first doped amorphous silicon layer 310 is formed as a discontinuous layer, which is naturally cut off by the patterned separator layer 304a.

Figure 2E:
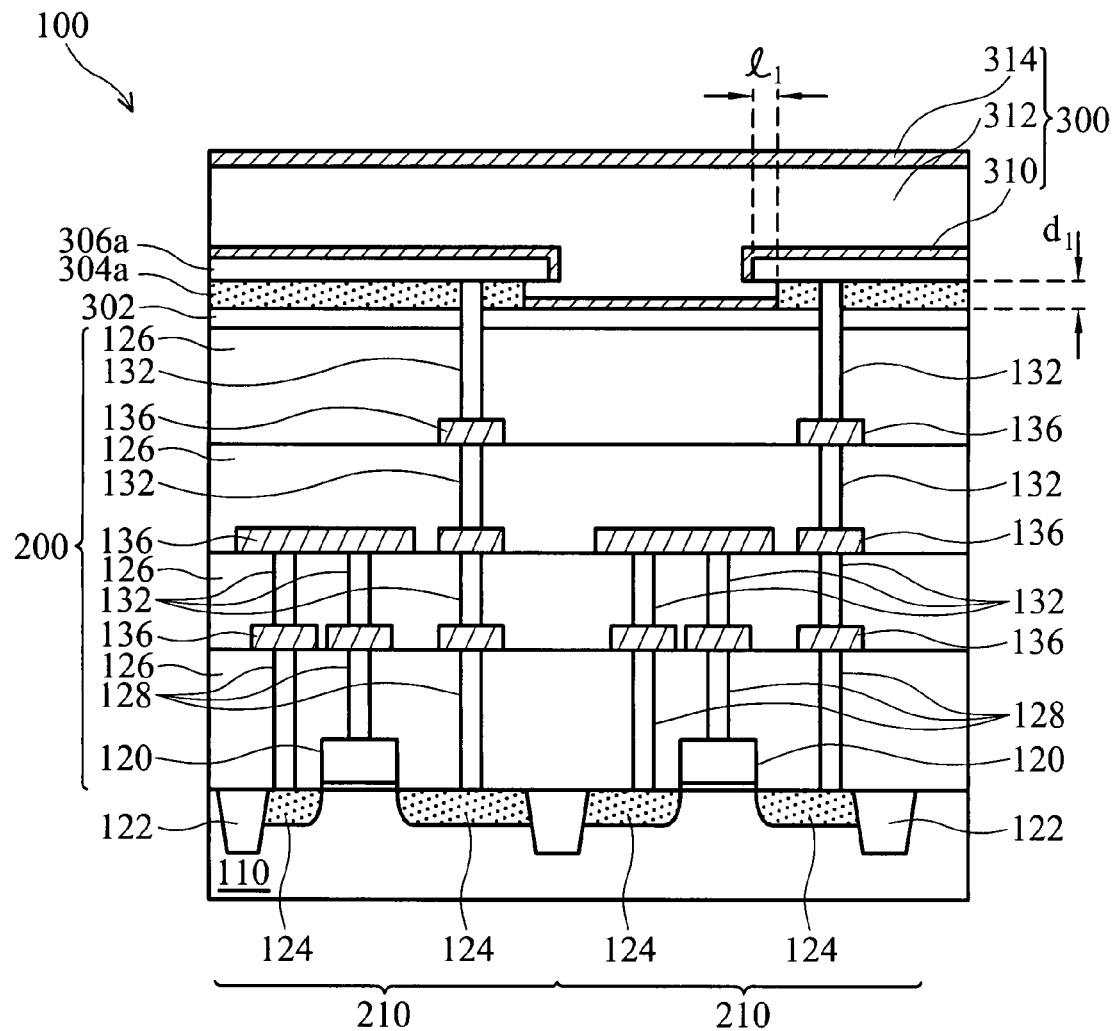

Next, referring to FIG. 2e, an undoped amorphous silicon layer 312 and a second doped amorphous silicon layer 314 are formed on the first doped amorphous silicon layer 310 to form a photodiode layer 300 in sequence. The photodiode layer 300 is a composite layer comprising the first doped amorphous silicon layer 310, the undoped amorphous silicon layer 312 and the second doped amorphous silicon layer 314. The first doped amorphous silicon layer 310 and the second doped amorphous silicon layer 314 are of different conductive type. For example, the first doped amorphous layer 310 is n-type while the second doped amorphous layer 314 is p-type, or the first doped amorphous layer 310 is p-type while the second doped amorphous layer 314 is n-type.

Figure 2F:
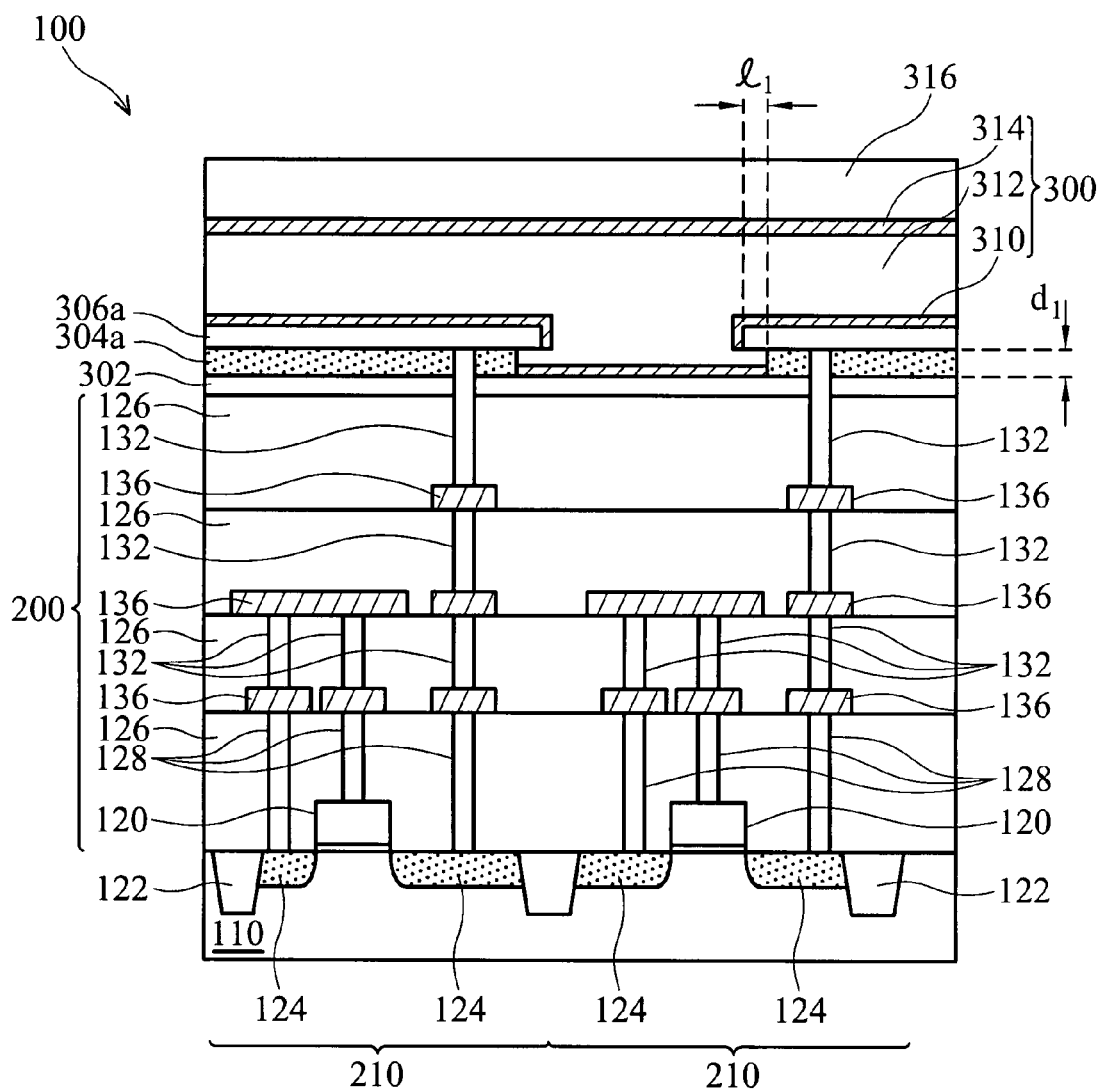

Referring to FIG. 2f, a transparent conductive layer 316 is formed on the photodiode layer 300 by, for example, vacuum evaporation, sputtering, chemical vapor deposition or sol-gel dip-coating. The transparent conductive layer 316 may comprise indium-tin-oxide (ITO), tin oxide, titanium nitride, thin salicide, or the like. A voltage is applied to the transparent conductive layer 316 to reverse-bias the photodiode layer 300. Electrons are generated by incidental light absorbed by the photodiode layer 300 and transported to the image sensor interconnect structure 200 in the pixel region 210 to output an electrical signal. Thus fabrication of the image sensor structure 100 in an embodiment of the invention is formed completed.

The aforementioned image sensor structure 100 comprises a substrate 110. An image sensor interconnect structure 200, a etching stop layer 302, a patterned separator layer 304a and a patterned electrode layer 306a are formed on the substrate 110 in sequence, wherein the patterned separator layer 304a has a thickness $d_1$, the side wall of the patterned separator layer 304a is recessed from the side wall of the patterned electrode layer 306a by a distance $l_1$. A first doped amorphous layer 310 is formed on the patterned electrode layer 306a and the patterned separator layer 304a, wherein the first doped amorphous layer 310 is a discontinuous layer. An undoped amorphous silicon layer 312 and a second doped amorphous silicon layer 314 are formed on the first doped amorphous silicon layer 310 to form a photodiode layer 300 in sequence. The photodiode layer 300 comprises the first doped amorphous silicon layer 310, the undoped amorphous silicon layer 312 and the second doped amorphous silicon layer 314. A transparent conductive layer 316 is formed on the photodiode layer 300.

In the described embodiments, the first doped amorphous layer 310 of the image sensor structure 100 is a discontinuous layer. Thus, the detected image signal in one pixel area does not affect the adjacent pixel area. The crosstalk problem can thus be reduced. Lower contact resistance between the first doped amorphous layer 310 and the patterned electrode layer 306a can be achieved by increasing the dopant concentration of the first doped amorphous layer 310. Ohmic contact between the first doped amorphous layer 310 and the patterned electrode layer 306a is then formed, and the performance of the image sensor structure 100 is improved. The first doped amorphous layer 310 is cut off naturally by controlling the aspect ratio ($d_1/l_1$) of the patterned separator layer 304a without requiring any additional lithography and etching processes. The advantages of lower manufacturing costs and higher manufacturing yield can be achieved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor structure comprising a plurality of pixels formed on a substrate, each pixel comprising:

an image sensor interconnect structure, an etching stop layer, a separator layer and an electrode layer formed on the substrate in sequence, wherein the separator layer has a first thickness, a side wall of the separator layer is recessed from a side wall of the electrode layer by a first distance; and a first doped amorphous silicon layer formed on the electrode layer, wherein a first portion of the separator layer and a first portion of the first doped amorphous silicon layer of the pixel are disconnected from a second portion of the separator layer and a second portion of the first doped amorphous silicon layer of an adjacent pixel, and the a third portion of first and second portions of the first doped amorphous silicon layer is also formed directly on the etching stop layer between the first and second portions of the separator layer of two adjacent pixels without electrically connecting to the electrode layer.

2. The image sensor structure as claimed in claim 1, wherein an etch selectivity of the separator layer to the etching stop layer is between about 1:1 and about 1000:1.

3. The image sensor structure as claimed in claim 1, wherein the etching a stop layer is nitride while the separator layer is an oxide, or the etching stop layer is an oxide while the separator layer a is nitride.

4. The image sensor structure as claimed in claim 1, wherein the electrode layer comprises TiN, aluminum, an alloy of aluminum, copper, an alloy of copper or copper-based conductive materials.

5. The image sensor structure as claimed in claim 1, wherein a ratio of the first distance to the first thickness is between 1:1 and 50:1.

6. The image sensor structure as claimed in claim 1, further comprising:
   an undoped amorphous silicon layer formed on the first doped amorphous silicon layer; and
   a second doped amorphous silicon layer formed on the undoped amorphous silicon layer to form a photodiode layer comprising the first doped amorphous silicon layer, the undoped amorphous silicon layer and the second doped amorphous silicon layer.

7. The image sensor structure as claimed in claim 6, wherein the first doped silicon amorphous layer is n-type while the second doped silicon amorphous layer is p-type, or the first undoped silicon amorphous layer is p-type while the second doped amorphous silicon layer is n-type.

8. The image sensor structure as claimed in claim 6, further comprising:
   a transparent conductive layer formed on the photodiode layer.

9. The image sensor structure as claimed in claim 8, wherein the transparent conductive layer comprises indium-tin-oxide, tin dioxide, titanium nitride or a thin salicide.

* * * * *